(12) United States Patent
Chuang

(10) Patent No.: US 7,295,431 B2
(45) Date of Patent: Nov. 13, 2007

(54) PORTABLE DISK WITH A PROTECTIVE HOUSING

(75) Inventor: Chi-Lin Chuang, Taipei (TW)

(73) Assignee: Apacer Technlogy Inc., Taipei (TW)

( * ) Notice: Subject to any disclaimer, the term of this patent is extended or adjusted under 35 U.S.C. 154(b) by 492 days.

(21) Appl. No.: 10/986,091

(22) Filed: Nov. 12, 2004

(65) Prior Publication Data
US 2006/0002069 A1  Jan. 5, 2006

(30) Foreign Application Priority Data
Jun. 30, 2004  (TW) .............................. 93119244 A

(51) Int. Cl.
*G06F 1/16*  (2006.01)
(52) U.S. Cl. ...................... 361/683; 439/131; 16/324
(58) Field of Classification Search ................ 361/683; D14/356; 439/131; 16/324, 326
See application file for complete search history.

(56) References Cited

U.S. PATENT DOCUMENTS

| | | | |
|---|---|---|---|
| 6,758,689 B1 * | 7/2004 | Bair et al. .................. | 439/136 |
| 6,792,487 B2 * | 9/2004 | Kao ............................ | 710/74 |
| 6,808,400 B2 * | 10/2004 | Tu .............................. | 439/131 |
| 6,963,468 B2 * | 11/2005 | Chang et al. ............. | 360/97.01 |
| 7,004,780 B1 * | 2/2006 | Wang ......................... | 439/353 |
| 7,009,847 B1 * | 3/2006 | Wu et al. ................... | 361/737 |
| 7,090,515 B2 * | 8/2006 | Regen et al. ............... | 439/131 |
| 2005/0161513 A1 * | 7/2005 | Huang et al. ............... | 235/492 |

* cited by examiner

*Primary Examiner*—Jayprakash Gandhi
*Assistant Examiner*—Ingrid Wright
(74) *Attorney, Agent, or Firm*—Rosenberg, Klein & Lee

(57) ABSTRACT

A portable disk device includes a protective housing with a containing room and a portable disk disposed inside the containing room via a movable pivot means. The portable disk can be rotated between the retraction and first positions. A torsion means is included to interact with the portable disk and the movable pivot means to store potential energy. A movable component is used to interact with interaction portions to make the portable disk able/unable to have a movement relative to the protective housing. At the retraction position, the portable disk is positioned inside the containing room and the torsion means has the potential energy to slide out the portable disk. After the interaction between the movable component and the interaction portions is released, the portable disk is slid out. Afterward, the portable disk can be placed at the second position and only has the electrical connector being placed outside.

11 Claims, 6 Drawing Sheets

PORTABLE DISK WITH A PROTECTIVE HOUSING

BACKGROUND OF THE INVENTION

1. Field of the Invention

The present invention is related to a portable disk with a protective housing, and more particularly, to a portable disk that can be slid out from the protective housing to a position for using. The protective housing is used to protect the portable disk.

2. Description of Related Art

Commonly, computer users usually need to carry electronic files. In the past, using 1.44 MB floppy discs is the most popular way. However, the floppy discs have the drawbacks of small storage capacity and large volume. They have been replaced since the plug & play universal serial bus (USB) discs, which have other names such as thumb drive and minidrive and hereinafter are called portable disc for convenience, were introduced into the market. In the present, the portable discs are very popular for computer users because they have small volume and large storage capacity.

Reference is made to FIG. 1. Conventionally, portable discs 90 have various outer shapes. In the aspect of structure, they generally have a USB connector 92 for connecting to an electronic device; a memory module, which is not shown in the figure and generally is a flash memory module, connected with the USB connector 92; and a housing 94 for covering the memory module. Since using the portable disc 90 needs to plug its USB connector 92 into a USB port (not shown) for electrical connection, the portable disc 90 may malfunction due to the damage of the USB connector 92 caused by improper use, e.g. carelessly dropping the portable disc 90 to the ground or pressing it heavily. Hence, the portable discs in the market usually are equipped with a cover to protect the USB connector. However, since the size of portable disc is small, it clear that the cover for the USB connector has a smaller size and hence it is easily lost after use. It turns out that the USB connector doesn't have a proper protection still.

Accordingly, as discussed above, the prior art still has some drawbacks that could be improved. The present invention aims to resolve the drawbacks in the prior art.

SUMMARY OF THE INVENTION

An objective of the present invention is to provide a portable disk with a protective housing. The portable disk is protected from damage by the protective housing when the portable disk is not in use.

Another objective of the present invention is to provide a portable disk with a protective housing. When the portable disk is slid out from the protective housing, the area of the portable disk covered by the protective housing is adjustable.

For achieving the objectives above, the present invention provides a combination includes: a protective housing, which is oblong and has a top plate, a lower plate and a containing room communicating with an outside space, wherein the containing room is located between the top plate and the lower plate and the tope plate and the bottom plate respectively have oblong openings defined thereon; a portable disk movably disposed in the containing room; a movable pivot means located at one end of the containing room and used for combining the portable disk with the protective housing to make the portable disk able to be rotated between a retraction position located inside the containing room and a first position located outside the containing room; and a lock means having a movable component disposed inside the movable pivot means, the lock means further having a first interaction portion and a second interaction portion respectively defined on the protective housing and the portable disk, the movable component being capable of longitudinally moving between the first position and a second position.

Therein, as the movable component is positioned at the first position, the movable component simultaneously interacts with the first interaction portion and the second interaction portion to make the portable disk unable to have a movement relative to the protective housing. As the movable component is positioned at the second position, the movable component is released from interacting with the first interaction portion and the second interaction portion so as to make the portable disk able to have a movement relative to the protective housing. When the portable disk is placed at the retraction position or the first position, the movable pivot means is located at the same end of the oblong openings. When the portable disk is positioned at the first position, the movable pivot means can be moved to another end of the oblong openings after the movable component is released from interacting with the first interaction portion and the second interaction portion. Thereby, the portable disk is positioned at the second position and only has an electrical connector located outside the protective housing. At this situation, the constraining function of the lock means is restored to make the portable disk unable to have a movement relative to the protective housing.

The present invention further has a torsion means, which has two ends respectively interacting with the portable disk and the movable pivot means so as to store a potential energy as a location of the portable disk is changed. Thereby, the portable disk can be rotated from the retraction position to the first position or other positions.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

Figure 1:
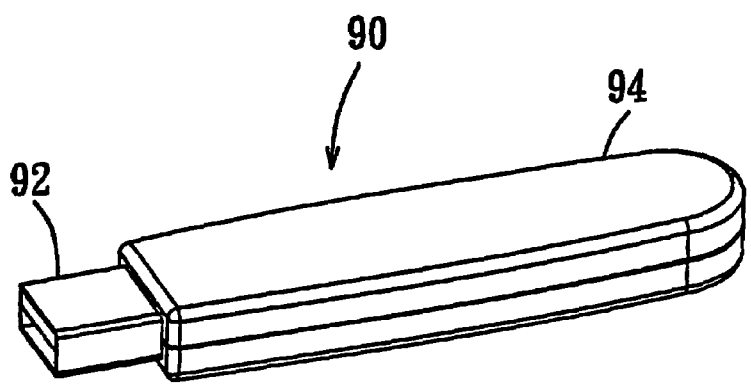
FIG. 1 is a schematic diagram of a conventional portable disk.
Figure 2:
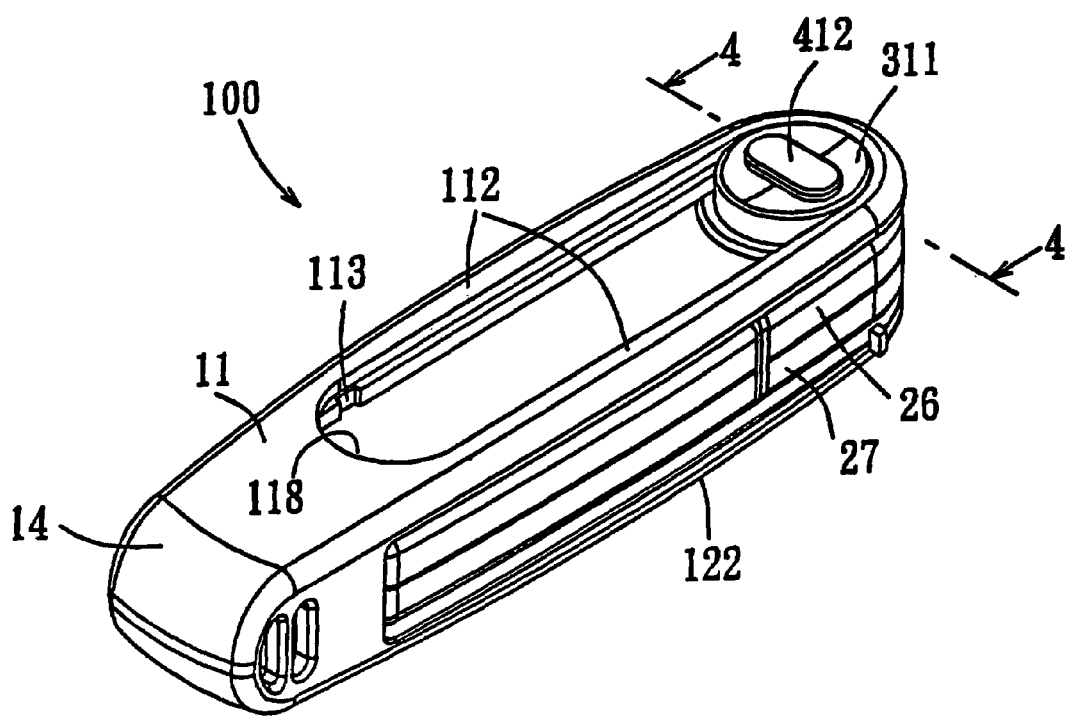
FIG. 2 is a combinative diagram of the first preferred embodiment in accordance with the present invention.

Reference is made to FIGS. 2-5, which are diagrams for illustrating the first embodiment of the present invention. Therein, the present invention is a combination 100 of a protective housing 1 and a portable disk 2. It further includes a movable pivot means 3, a lock means 4 and a torsion means 5. The protective housing 1 is an oblong shield. In this embodiment, the protective housing 1 is transparent and made of acrylic material. It is U-shaped and has a top plate 11 and a bottom plate 12 arranged in parallel, and a containing room 13 located between the top plate 11 and the bottom plate 12.

The protective housing 1 further has a connection portion 14 connecting the top plate 11 with the bottom plate 12 and an open end 15 disconnecting the top plate 11 from the bottom plate 12. The tope plate 11 and the bottom plate 12 of the protective housing 1 respectively have oblong openings 110 and 120 connecting with the containing room 13. The oblong openings 110 and 120 respectively have straight portions 112 and 122 defined therein. The straight portions 112 and 122 form a track for the movable pivot means 3.

The straight portion 112 of the top plate 11 has two sides, each of which has a stair-shaped surface formed by a first stair portion 114 and a second stair portion 116. The first stair portions 114 of the two sides of the straight portion 112 are close to the center of the top plate 11 and the second stair portions 116 are respectively close to the two sides of the top plate 11. The straight portion 122 of the bottom plate 12 also has two sides, each of which has a stair-shaped surface formed by a first stair portion 124 and a second stair portion 126. The first stair portions 124 of the two sides of the straight portion 122 are close to the center of the bottom plate 12 and the second stair portions 126 are respectively close to the two sides of the bottom plate 12. The distance between the first stair portions 114 of the top plate 11 is smaller than that of the second stair portions 116 and the distance between the first stair portions 124 of the bottom plate 12 is smaller than that of the second stair portions 126. The distance between the first stair portions 114 of the top plate 11 is equal to that between the first stair portions 124 of the bottom plate 12. Similarly, the distance between the second stair portions 116 of the top plate 11 is equal to that between the first stair portions 124 of the bottom plate 12. The two ends of the second stair portions 116 of the straight portion 112 of the top plate 11 are connected via semicircular portions 118. The two ends of the second stair portions 126 of the straight portions 122 of the bottom plate 12 are connected via semicircular portions 128.

Each of the first stair portions 114 of the oblong opening 110 of the top plate 11 has two indentations 113 respectively close to the borders between the second stair portion 116 and the semicircular portions 128 of the top plate 11. Hence, there are four indentations 113 disposed on the first stair portions 114 of the oblong opening 110 of the top plate 11 in total.

The portable disk 2, pivotally arranged in the containing room 13, has a universal serial bus (USB) connector 21 capable of being electrically connected to a USB port (not shown) of an external electronic device, a memory module 23 (a flash memory module) connected to the USB connector 21, and a plastic housing 250 for covering the memory module 23. The USB connector 21 and the memory module 23 connected to the USB connector 21 of the portable disk 2 are the same as that of prior art. However, since this portion is not the key feature of the present invention, it will not be described in detail.

Figure 3:
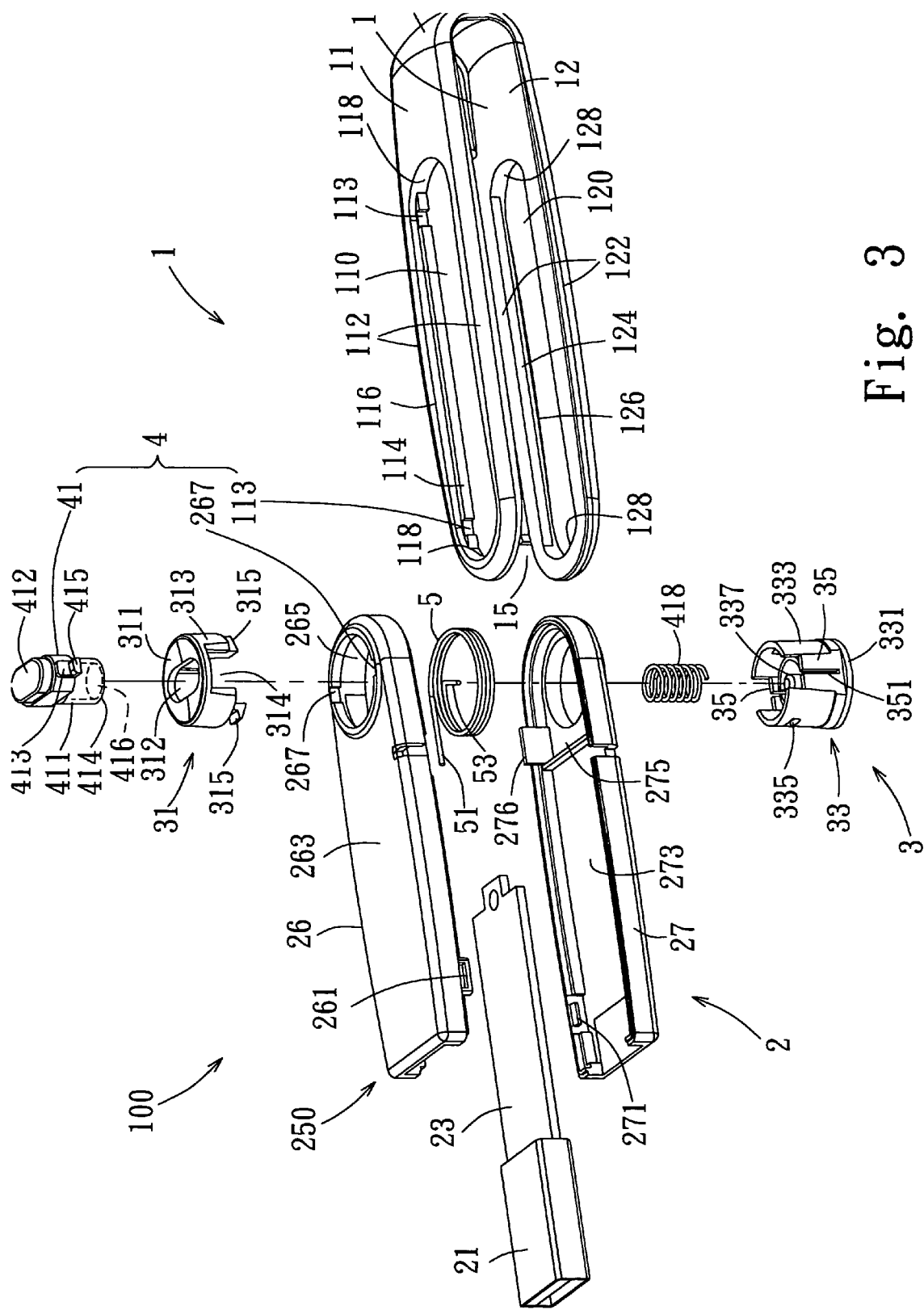
FIG. 3 is an exploded diagram of the first preferred embodiment in accordance with the present invention.

The plastic housing 250 covers the memory module 23 of the portable disk 2. It is composed of an upper cover 26 and a lower cover 27. The plastic housing 250 can be assembled by various ways, which is not limited in the present invention and can be any methods in the prior art. For example, the plastic housing 250 can be assembled by using male portions and female portions thereon. In this embodiment, as shown in FIG. 3, each of the two sides of the upper cover 26 has a fastening ring 261 and the corresponding position of each side of the lower cover 27 has a fastening hook 271. During assembly, the fastening ring 261 and the fastening hook 271 are used to fasten the upper cover 26 and the lower cover 27.

The upper cover 26 and the lower cover 27 of the plastic housing 250 have the same shape and length. Their length is longer than that of the memory module 23. The upper cover 26 and the lower cover 27 have base plates 263 and 273, respectively. Except for the open ends, both of the base plates 263 and 273 have walls surrounding thereof. Besides, the shape of the other ends, opposed to the open ends, of the base plates 263 and 273 are semicircular.

After assembly, the open end of the plastic housing 250 is close to and contacts with the USB connector 21. The other end of the plastic housing 250, i.e. the end away from the USB connector 21, is formed with a hollow portion 275, which cannot be reached by the memory module 23. The base plates 263 and 273 of the upper cover 26 and the lower cover 27 are formed with a circular through hole 265 located at the position of the hollow portion 275. The upper cover 26 has two indentations 267 defined inside of the circular through hole 265, in which the two indentations 267 are opposed to each other. Inside the hollow portion 275 is a retaining plate 276, which is used to fasten one end 51 of the torsion means 5 contained in the hollow portion 275.

The portable disk 2 and the protective housing 1 are combined together by using a movable pivot means 3. Thereby, the portable disk 2 is capable of pivoting on the movable pivot means 3 between a retraction position P1 inside the containing room 13 and a first position P2 outside the containing room 13. In this embodiment, from the retraction position P1 to the first position P2, the portable disk 2 rotates 180° in total. Besides, the portable disk 2 rotates along a plane parallel to the top plate 11 and the bottom plate 12.

After the portable disk 2 and the protective housing 1 are combined, the two indentations 267 of the portable disk 2 will interact with the two indentations 113 close to the open end 15 of the protective housing 1 if the portable disk 2 is positioned at the retraction position P1. This interaction will be described later. If the portable disk 2 is rotated 180° from the retraction position P1 to the first position P2, the two indentations 267 of the portable disk 2 will also interact with the two indentations 113 close to the open end 15 of the protective housing 1. This interaction will also be described later. Then, if the disk 2 is moved from the ends of the oblong openings 110 and 120 close to the open end 15 to the other ends of the oblong openings 110 and 120, the two indentations 267 of the portable disk 2 will interact with the two indentations 113 close to the connection portion 14 of the protective housing 1. This interaction will also be described later.

In this embodiment, the movable pivot means 3 is hollow. It is composed of an upper sleeve 31 and a lower sleeve 33. The upper sleeve 31 is hollow and composed of a round top cover 311, a wall 313 surrounding thereof and two crooks 315. In addition, the top cover 311 of the upper sleeve 31 has a through hole 312 defined thereon. The lower sleeve 33 is also hollow and composed of a round bottom plate 331 and a wall 333 surrounding thereof. The movable pivot means 3 is assembled by using the male portions and female portions of the upper sleeve 31 and the lower sleeve 33. The upper sleeve 31 has two crooks 315 (male portions) longitudinally extended from the wall 313 and the lower sleeve 31 has two fastening slots 335 (female portions), which corresponds to the two crooks 315, defined on the wall 333. The upper sleeve 31 and the lower sleeve 33 is combined via the two crooks 315 and the two fastening slots 335. Furthermore, the top cover 311 has the same diameter as that of the bottom plate 331.

The lower sleeve 33 is formed with an internal round base 337, whose function will be described later. The wall 313 of the upper sleeve 31 has two indentations 314 defined thereon. The two indentations 314 are opposed to each other. The indentations 314 reach to the top cover 311 of the upper sleeve 31 and have a predetermined width. The portions of the wall 333 of the lower sleeve 33 corresponding to the indentations 314 of the upper sleeve 31 are flat and have a height smaller than that of the other portions of the wall 333. Hence, after the upper sleeve 31 is combined with the lower sleeve 33, the movable pivot means 3 has two flat portions 35 at its two sides (the other sides of the movable pivot means 3 are cambered walls). The flat portions 35 include the indentations 314 and are extended from the top cover 311 to the bottom plate 331 of the lower sleeve 33. Each of the flat portions at the two sides of the lower sleeve 33 has a longitude slot 351 defined thereon. The distance of the two flat portions of the lower sleeve 33 is smaller than the diameter of the top cover 311 or the bottom plate 331.

After the portable disk 2 is combined with the protective housing 1, the top cover 311 and the bottom plate 331 of the upper sleeve 31 and the lower sleeve 33 of the movable pivot means 3 are respectively constrained by the two second stair portions 116, 126 and the semicircular portions 118, 128. Hence, with the movable pivot means 3, the portable disk 2 can be securely and pivotally combined with the protective housing 1. The flat portions 35 of the movable pivot means 3 are located between the upper first stair portions 114 and between the lower first stair portions 124. Thereby, the movable pivot means 3 can be freely moved within the oblong openings 110 and 120.

When the disk 2 is positioned at the retraction position P1 inside the containing room 13, the USB connector 21 is close to the connection portion 14 of the protective housing 1. At this moment, the movable pivot means 3 is close to the semicircular portions 118, 128 at the open end 15 of the protective housing 1. The movable pivot means 3 is arranged within the through hole 265 of the portable disk 2. One end of the movable pivot means 3 is close to the semicircular portion 118 in the oblong opening 110 of the top plate 11 of the protective housing 1. The other end of the movable pivot means 3 is close to the semicircular portion 128 in the oblong opening 120 of the bottom plate 12 of the protective housing 1. When the disk 2 is rotated from the retraction position P1 to the first position P2, the location of the movable pivot means 3 is unchanged.

As described above, the torsion means 5 is contained within the hollow portion 275. In this embodiment, the torsion means 5 is a torsion spring with a ring shape. It has two ends 51, 53. The torsion means 5 is placed in the hollow portion 275 and passed through by the movable pivot means 3. One end 51 of the torsion means 5 is fastened by the retaining plate 276 inside the hollow portion 275. The other end 53 of the torsion means 5 is fastened by the movable pivot means 3. Hence, when the portable disk 2 is rotated from one position to another, the torsion means 5 stores or releases potential energy. In this embodiment, the torsion means 5 stores potential energy when the portable disk 2 is rotated from the retraction position P1 to the first position P2.

After the portable disk 2 is combined with the protective housing 1, each of the indentations 267 of the disk 2 is positioned close to one of the indentations 113 but still has a fixed distance therefrom. Besides, the indentations 267 are not respectively located in the longitudinal lines of the indentations 113, in which the longitudinal lines are vertical to the base plate 263 or 273. The indentations 267 are located in an outside longitudinal line and the indentations 113 are located in an inside longitudinal line.

The lock means 4 is composed of a movable component 41 disposed inside the movable pivot means 3, first interaction portions 113 disposed on the protective housing 1 and second interaction portions 267 disposed on the portable disk 2. The first interaction portions 113 of the protective housing 1 are the indentations 113 of the top plate 11 and the second interaction portions 267 of the portable disk 2 are the indentations 267 defined inside the circular through hole 265 of the upper cover 26.

The movable component 41 is disposed inside the hollow movable pivot means 3 and has a longitudinal body 411, two projective blocks 413 extended from two opposite sides of the longitudinal body 411 and two projective poles 415 respectively formed below the projective blocks 413. The height of the projective poles 415 is greater than that of the projective blocks 413. The difference between the heights of the projective pole 415 and the projective block 413 is equal to the spacing between one of the indentations 267 and a close one of the indentations 113. Each pair of the projective poles 415 and projective blocks 413 forms a stair shape.

The longitude body 411 has a top 412 and a bottom 414. The top 412 of the longitude body 411 is projected out from the through hole 312 defined on the top cover 311 of the upper sleeve 31 for a user to press. The bottom 414 of the longitude body 411 has a sleeve 416 formed thereon. When the movable component 41 is disposed inside the movable pivot means 3, a spring 418 also has to be disposed inside the movable pivot means 3. One end of the spring 418 is placed inside the sleeve 416 of the bottom 414 of the longitude body 411 and the other end is placed on the internal round base 337 of the lower sleeve 33. The top 412 of the longitude body 411 is projected out from the through hole 312 defined on the top cover 311 of the upper sleeve 31. The projective poles 415 and the projective blocks 413 extended from the two sides of the longitude body 411 are located within the indentations 314 defined on the wall 313 of the movable pivot means 3.

Therein, the two projective blocks 413 are respectively arranged within the indentations 113 of the first stair portions 114 formed inside the oblong opening 110 of the top plate 11 (the interaction between the movable component 41 and the first interaction portions 113). The two projective poles 415 are respectively arranged within the indentations 267 of the circular through hole 265 defined on the upper cover 26 of the portable disk 2 (the interaction between the movable component 41 and the second interaction portions 267). At this situation, the movable component 41 is located at the first position P2 and makes the portable disk 2 unable to have a movement relative to protective housing 1.

When a user presses the top 412 of the longitude body 411, the spring 418 is compressed and the movable component 41 is moved longitudinally within the hollow movable pivot means 3. At this moment, the projective blocks 413 extended from the two sides of the longitudinal body 411 are also longitudinally moved within the indentations 314 of the movable pivot means 3 and thereby moved away from the indentations 113 of the oblong opening 110 of the top plate 11 (the interaction between the movable component 41 and the first interaction portions 113 is released). Furthermore, the projective poles 415 extended from the two sides of the longitudinal body 411 are also longitudinally moved within the indentations 314 of the movable pivot means 3 and thereby moved away from the indentations 267 of the circular through hole 265 defined on the upper cover 26 of the portable disk 2 (the interaction between the movable component 41 and the second interaction portions 267 is released).

Although the projective blocks 413 and the projective poles 415 are moved downward simultaneously, the situation that the projective blocks 413 are moved away from the indentations 113 but constrained by the indentations 267 will not happen because the indentations 267 are located in an outside longitudinal line and the indentations 113 are located in an inside longitudinal line. The longitudinal body 411 is pushed and moved longitudinally until the two projective poles 415 reaches to the tops of the flat portions of the lower sleeve 33. At this moment, the movable component 41 is located at the second position P3 and the portable disk 2 is released and able to have a movement relative to the protective housing 1. Moreover, the potential energy stored in the torsion means 5 is released to make the portable disk 2 rotated from the retraction position P1 to the first position P2. Subsequently, the movable pivot means 3 can be moved from the semicircular portions 118, 128 of the oblong openings 110, 120 at the open end 15 to the semicircular portions 118, 128 close to the connection portion 14.

In accordance with the description above, it is obvious that pressing the top 412 of the longitudinal body 411 makes the projective blocks 413 and the projective poles 415 move downward to respectively leave away from the indentations 113 of the oblong opening 110 of the top plate 11 (the interaction between the movable component 41 and the first interaction portions 113 is released) and the indentations 267 of the circular through hole 265 defined on the upper cover 26 (the interaction between the movable component 41 and the second interaction portions 267 is released). At this moment, the potential energy stored in the torsion means 5 is released to make the portable disk 2 rotated 180° from the retraction position P1 to the first position P2. Once the portable disk 2 is rotated 180°, the longitudinal body 411 is moved back to the original position (i.e. the first position P2) due to the elasticity of the spring 418 and the movement of the portable disk 2 relative to the protective housing 1 is constrained again.

Figure 6:
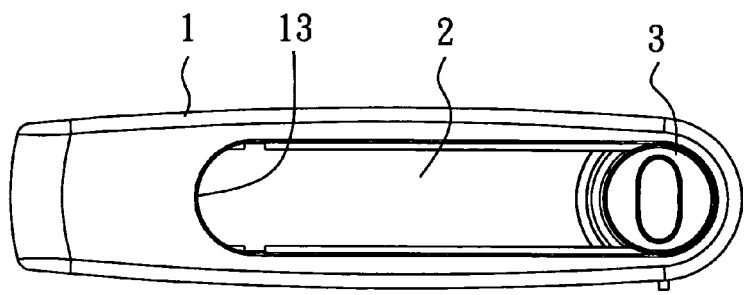
FIGS. 6-10 are diagrams for illustrating the relative movement and relation of the components in the first preferred embodiment complied with the present invention.

Reference is made to FIGS. 6-10, which is used to illustrate the relative movement and relation of the protective housing 1, the portable disk 2 and the movable pivot means 3. FIG. 6 shows that the portable disk 2 is pivotally disposed inside the containing room 13 of the protective housing 1 via the movable pivot means 3. At this moment, the portable disk 2 is positioned at the retraction position P1. Please also refer to FIG. 4. When the movable component 41 is located at the first position P2, it interacts with the first and second interaction portions 113, 267 and the movement of the portable disk 2 relative to the protective housing 1 is constrained. At this situation, the USB connector 21 of the portable disk 2 is close to the connection portion 14 of the protective housing 1 and the movable pivot means 3 is close to the semicircular portions 118, 128 located at the open end 15 of the protective housing 1.

Figure 5:
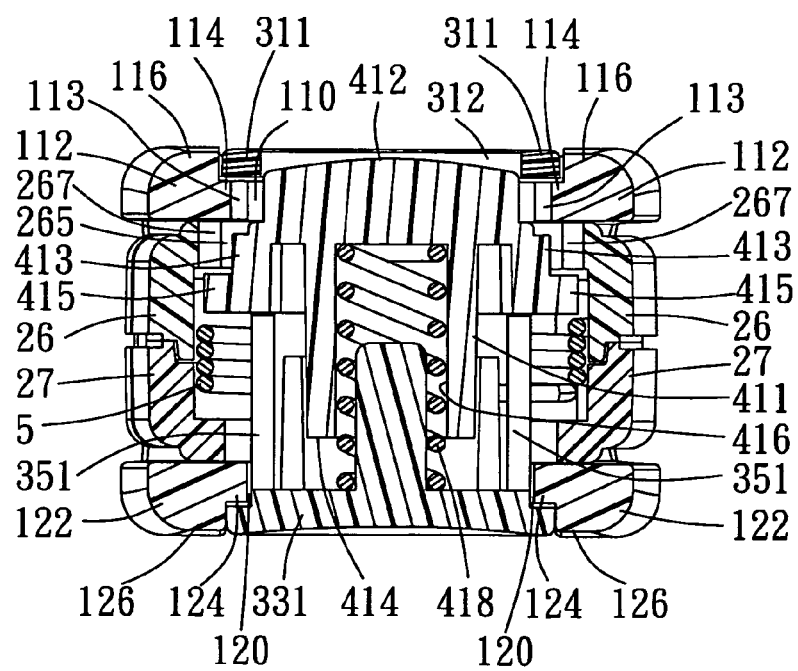
FIG. 5 is a cross-sectional view of the first preferred embodiment in accordance with the present invention, where the movable component is located at the second position.
Figure 7:
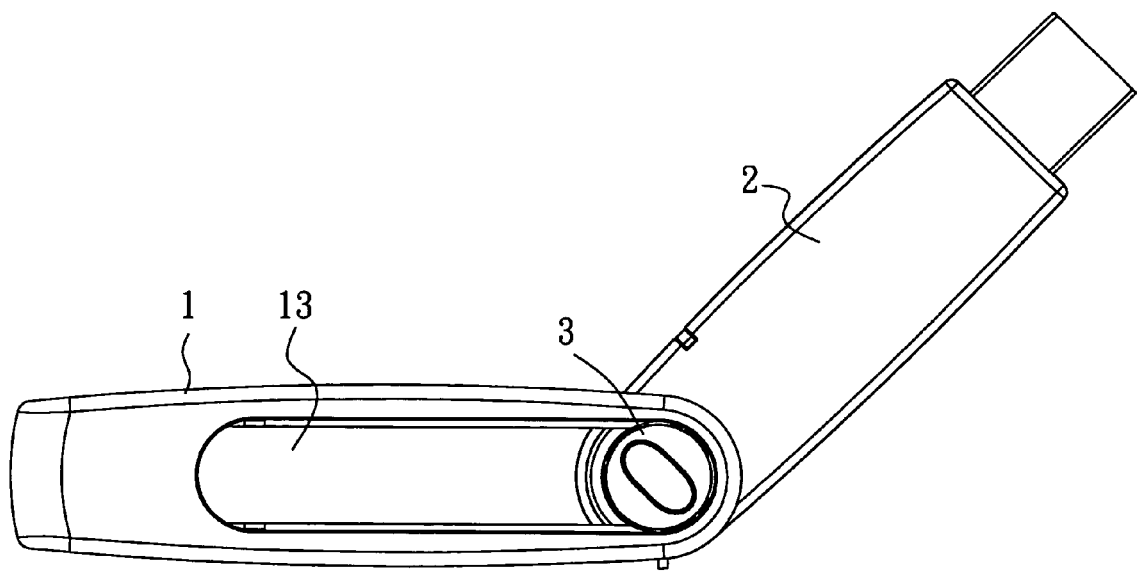
Figure 8:
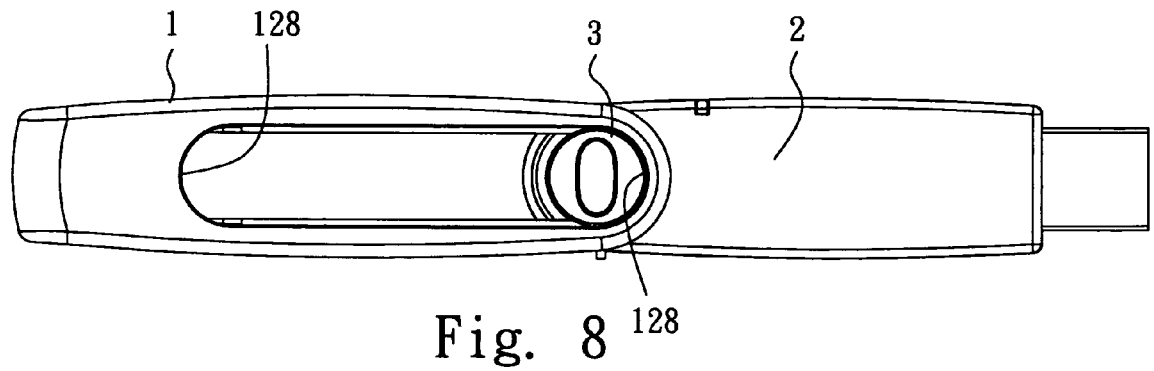

Please refer to FIG. 5, when a user wants to use the portable disk 2, he can press the top 412 of the longitudinal body 411 to release the interaction between the between the movable component 41 and the first interaction portions 113 or the second interaction portions 267. Subsequently, the potential energy stored in the torsion means 5 is released to rotate the portable disk 2 from the retraction position P1 to the first position P2 automatically. As shown in FIGS. 7-8, FIG. 7 illustrates the rotation of the portable disk 2 and FIG. 8 illustrates that the portable disk 2 is positioned at the first position P2. When the portable disk 2 is positioned at the first position P2, the movable component 41 is also pushed back to the first position P2 and makes the movement of the portable disk 2 relative to the protective housing 1 is constrained again.

Figure 4:
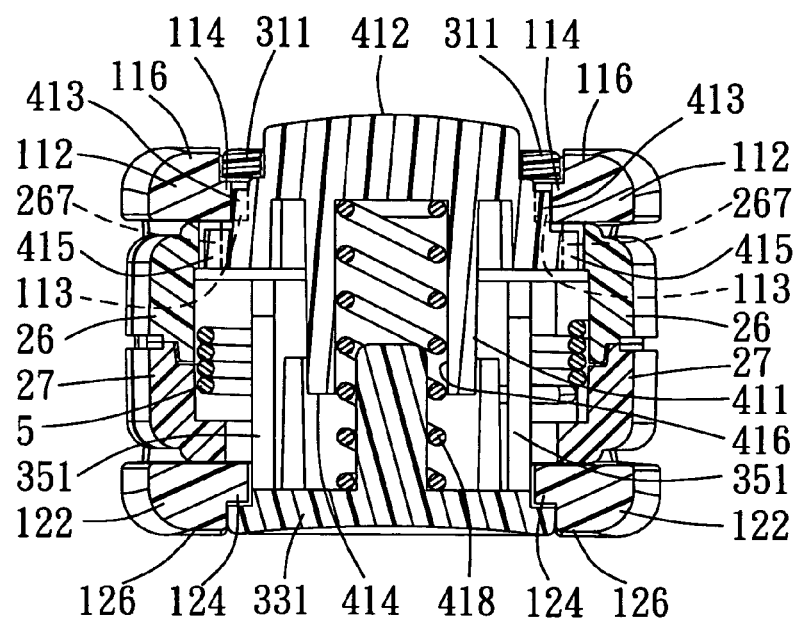
FIG. 4 is a cross-sectional view of the first preferred embodiment in accordance with the present invention, where the movable component is located at the first position.
Figure 9:
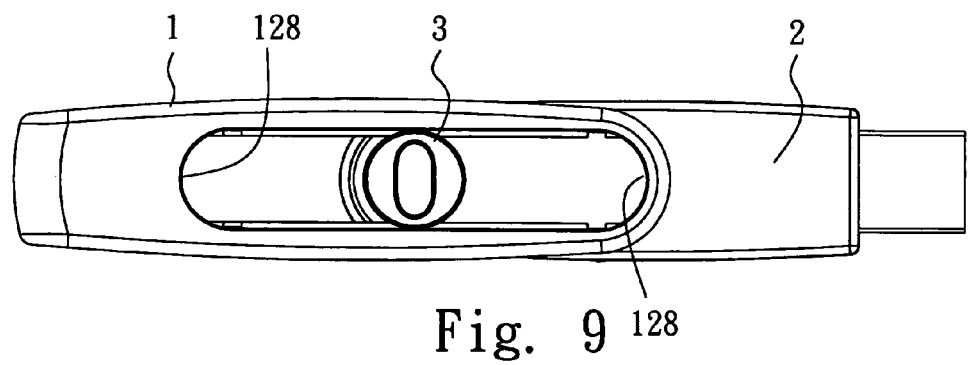
Figure 10:
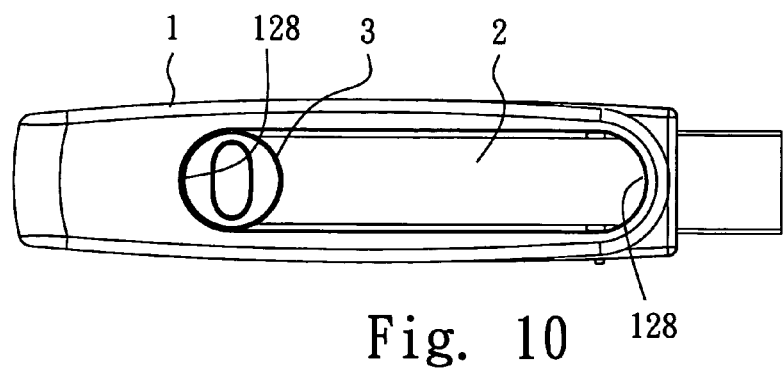

Reference is made to FIGS. 9-10 together with FIGS. 3-4. If necessary (for example, the portable disk 2 is unallowable to be used in the manner of the first position P1 due to the environment), the user can press the top 412 of the longitudinal body 411 to release the interaction between the movable component 41 and the first interaction portions 113 or the second interaction portions 267 and then moves the movable pivot means 3 along the parallel straight portions 112 and 122 of the oblong openings 110 and 120 from one end to the other. Namely, the movable pivot means 3 can be moved from the semicircular portions 118, 128 located at one end of the oblong openings 110 and 120 to the semicircular portions 118, 128 located at the other end of the oblong openings 110 and 120 along the track formed by the parallel straight portions 112 and 122. Because there are two pairs of indentations 113 respectively defined at the two ends of the oblong opening 110, the movable component 41 can be moved back to the first position P2 to interact with the first and second interaction portions 113, 267 even if the movable pivot means 3 is moved to the other end of the oblong opening 110 (i.e. the movable pivot means 3 is moved from the first position P2 to the second position P3). Hence, when the pivot means 3 is moved to the other end of the oblong opening 110, the movement of the portable disk 2 relative to the protective housing 1 is also constrained due to the movable component 41. At the situation of being positioned at the second position P3, the memory module 23 of the portable disk 2 is located in the containing room 13 and only the USB connector 21 is located outside the protective housing 1.

Figure 11:
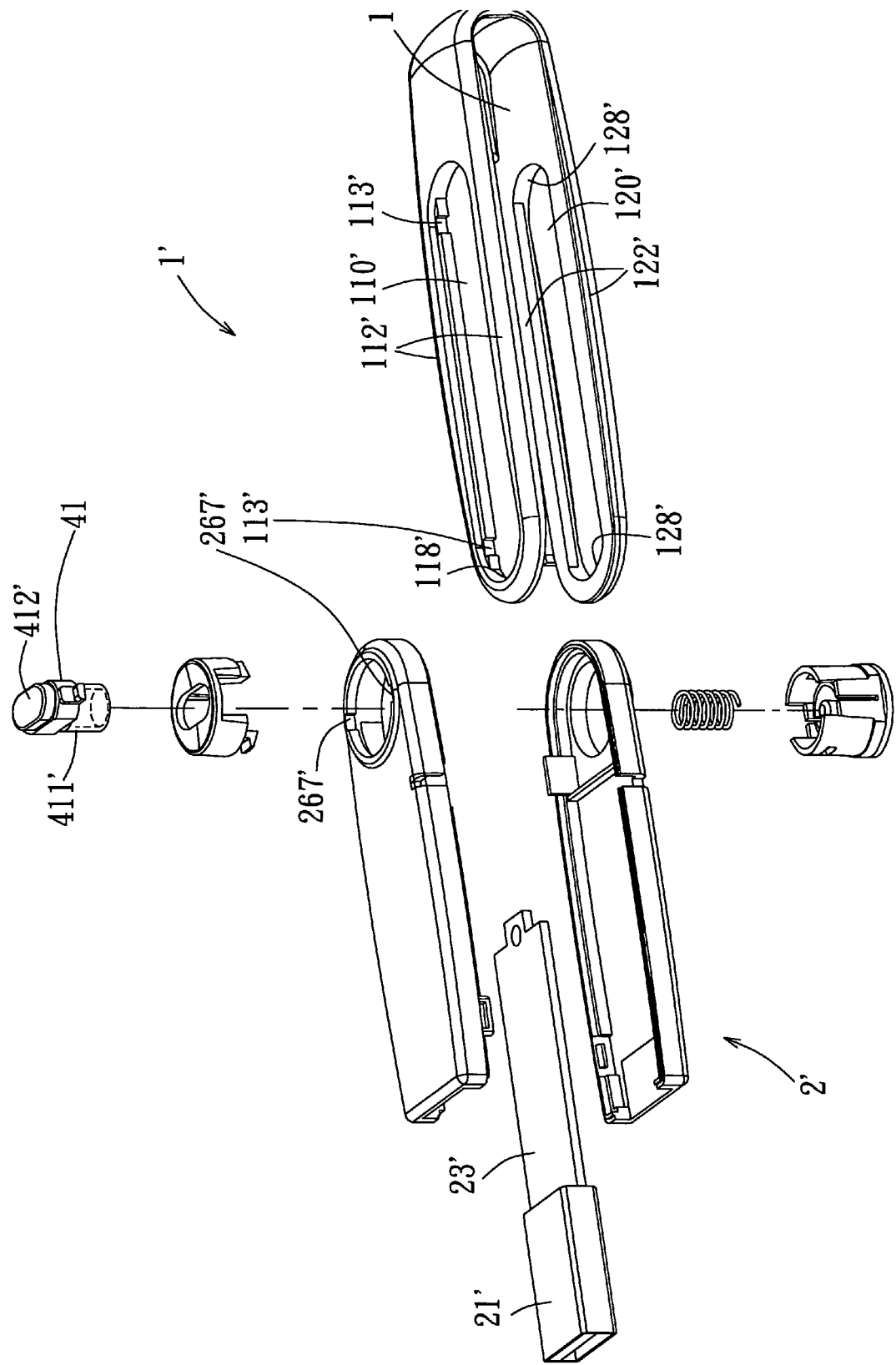
FIG. 11 is an exploded diagram of the second preferred embodiment in accordance with the present invention.

The second embodiment, as shown in FIG. 11, only has a portion different to the first embodiment. In the second embodiment, there is not torsion means. Hence, when a user presses the top 412' of the longitudinal body 411' to release the interaction between the movable component 41' and the first interaction portions 113'or the second interaction portions 267', the user needs to artificially move the portable disk 2' out from the containing room 13' of the protective housing 1' or back into the protective housing 1'. Similar to the first embodiment, the portable disk 2' of the second embodiment can be moved from the semicircular portions 118', 128' located at one end of the oblong openings 110' and 120' to the semicircular portions 118', 128' located at the other end of the oblong openings 110' and 120' along the track formed by the parallel straight portions 112' and 122'. As being moved from the first position P1 to the second position P3, the memory module 23' of the portable disk 2' is located in the containing room 13' and only the USB connector 21' is located outside the protective housing 1'. Since a person who is familiar to this field can easily realize the operation of the second embodiment according to the first embodiment described above, the second embodiment is not detailed here.

Although the present invention has been described with reference to the preferred embodiment thereof, it will be understood that the invention is not limited to the details thereof Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A portable disk device comprising:
   a protective housing having a containing room communicating with an outside space;
   a portable disk having a movable pivot means, which is used for pivotally disposing the portable disk inside the containing room so as to make the portable disk able to be positioned at a retraction position or a first position;
   a torsion means having two ends respectively interacting with the portable disk and the movable pivot means so as to store a potential energy as a location of the portable disk is changed; and
   a lock means having a movable component disposed inside the movable pivot means, the lock means further having a first interaction portion and a second interaction portion respectively defined on the protective housing and the portable disk, the movable component being capable of longitudinally moving between the first position and a second position, wherein the movable component simultaneously interacts with the first interaction portion and the second interaction portion to make the portable disk unable to have a movement relative to the protective housing as the movable component is positioned at the first position via an external force, and the movable component is released from interacting with the first interaction portion and the second interaction portion so as to make the portable disk able to have a movement relative to the protective housing as the movable component is positioned at the second position via another external force.

2. The portable disk device as claimed in claim 1, wherein the torsion means includes a torsion spring with a ring shape.

3. The portable disk device as claimed in claim 1, wherein the portable disk further comprises:
   a universal serial bus (USB) connector capable of electrically connecting with a USB port of an external electronic device;
   a memory module electrically connecting with the USB connector; and
   a housing for covering the memory module, the housing having an upper cover and a lower cover, wherein length of the housing is larger than that of the memory module, the housing has an open end, and another end of the housing is unreachable for the memory module and formed with a hollow portion having a circular through hole.

4. The portable disk device as claimed in claim 1, wherein the movable pivot means is hollow and further comprises an upper sleeve and a lower sleeve; the upper sleeve has two opposite sides, each of which has a crook downward extended therefrom; the lower sleeve has two sides, each of which has a fastening slot located at a position corresponding to the crook; and the crook and the fastening slot are used to combine the upper sleeve with the lower sleeve.

5. The portable disk device as claimed in claim 1, wherein the protective housing has a top plate and a bottom plate, the top plate and the bottom plate respectively have oblong openings defined thereon.

6. The portable disk device as claimed in claim 1, wherein the portable disk is rotated 180° from the retraction position to the first position.

7. A portable disk device comprising:
   a protective housing having a containing room communicating with an outside space;
   a portable disk movably disposed in the containing room;
   a movable pivot means located at one end of the containing room and used for combining the portable disk with the protective housing to make the portable disk able to be rotated between a retraction position located inside the containing room and a first position located outside the containing room; and
   a lock means having a movable component disposed inside the movable pivot means, the lock means further having a first interaction portion and a second interaction portion respectively defined on the protective housing and the portable disk, the movable component being capable of longitudinally moving between the first position and a second position, wherein the movable component simultaneously interacts with the first interaction portion and the second interaction portion to make the portable disk unable to have a movement relative to the protective housing as the movable component is positioned at the first position via a first external force, and the movable component is released from interacting with the first interaction portion and the second interaction portion so as to make the portable disk able to have a movement relative to the protective housing as the movable component is positioned at the second position via a second external force; wherein if the portable disk is positioned at the first position, the movable pivot means is able to be moved to another end of the containing room via a third external force after the movable component is released from interacting with the first interaction portion and the second interaction portion; thereby, the portable disk only has an electrical connector located outside the protective housing.

8. The portable disk device as claimed in claim 7, wherein the portable disk further comprises:
   a universal serial bus (USB) connector capable of electrically connecting with a USB port of an external electronic device;
   a memory module electrically connecting with the USB connector; and
   a housing for covering the memory module, the housing having an upper cover and a lower cover, wherein length of the housing is larger than that of the memory module, the housing has an open end, and another end of the housing is unreachable for the memory module and formed with a hollow portion having a circular through hole.

9. The portable disk device as claimed in claim 7, wherein the movable pivot means is hollow and further comprises an upper sleeve and a lower sleeve; the upper sleeve has two opposite sides, each of which has a crook downward extended therefrom; the lower sleeve has two sides, each of which has a fastening slot located at a position corresponding to the crook; and the crook and the fastening slot are used to combine the upper sleeve with the lower sleeve.

10. The portable disk device as claimed in claim 7, wherein the protective housing has a top plate and a bottom plate, the top plate and the bottom plate respectively have oblong openings defined thereon.

11. The portable disk device as claimed in claim 7, wherein the portable disk is rotated 180° from the retraction position to the first position.

* * * * *